(12) United States Patent
Johnson

(10) Patent No.: US 12,388,235 B2
(45) Date of Patent: Aug. 12, 2025

(54) TUNABLE VCSEL POLARIZATION CONTROL WITH INTRACAVITY SUBWAVELENGTH GRATING

(71) Applicant: Excelitas Technologies Corp., Waltham, MA (US)

(72) Inventor: Bartley C. Johnson, North Andover, MA (US)

(73) Assignee: Excelitas Technologies Corp., Waltham, MA (US)

( * ) Notice: Subject to any disclaimer, the term of this patent is extended or adjusted under 35 U.S.C. 154(b) by 731 days.

(21) Appl. No.: 17/706,682

(22) Filed: Mar. 29, 2022

(65) Prior Publication Data

US 2022/0311213 A1 Sep. 29, 2022

Related U.S. Application Data

(60) Provisional application No. 63/167,209, filed on Mar. 29, 2021.

(51) Int. Cl.
*H01S 3/098* (2006.01)
*H01S 5/028* (2006.01)
(Continued)

(52) U.S. Cl.
CPC ........ *H01S 5/18366* (2013.01); *H01S 5/0281* (2013.01); *H01S 5/041* (2013.01);
(Continued)

(58) Field of Classification Search
CPC .... H01S 5/18366; H01S 5/0281; H01S 5/041; H01S 5/068; H01S 5/18361; H01S 5/18383; H01S 5/18386; H01S 5/343
See application file for complete search history.

(56) References Cited

U.S. PATENT DOCUMENTS 6,661,830 B1 * 12/2003 Reed ................... H01S 5/18386
372/99
2007/0153860 A1 * 7/2007 Chang-Hasnain ... G02B 5/1809
359/558
(Continued)

FOREIGN PATENT DOCUMENTS

EP        2 525 450 A1    11/2012
GB        2582378 A        9/2020
WO   WO 2018/067837 A1    4/2018

OTHER PUBLICATIONS

International Search Report and Written Opinion for International Application No. PCT/US2022/022244 mailed Jul. 12, 2022.
(Continued)

*Primary Examiner* — Kinam Park
(74) *Attorney, Agent, or Firm* — Wolf, Greenfield & Sacks, P.C.

(57) ABSTRACT

A very strong selection mechanism is provided in a tunable vertical cavity surface emitting laser (VCSEL) by manipulating the laser threshold to be different for TE and TM polarization by a employing a subwavelength grating in the laser cavity. The laser selects the polarization with the lowest threshold. The grating does not diffract and does not add loss to the cavity. It works by creating a large birefringence layer between the semiconductor and air sub-cavities of the full VCSEL. Multilayer stack calculations show that this results in a lower threshold for the TM polarization over the TE. This subwavelength grating layer, in one embodiment, replaces the AR coating on the semiconductor surface.

18 Claims, 7 Drawing Sheets

(51) Int. Cl.
H01S 5/04 (2006.01)
H01S 5/068 (2006.01)
H01S 5/183 (2006.01)
H01S 5/343 (2006.01)

(52) U.S. Cl.
CPC .......... *H01S 5/068* (2013.01); *H01S 5/18361* (2013.01); *H01S 5/18383* (2013.01); *H01S 5/18386* (2013.01); *H01S 5/343* (2013.01)

(56) References Cited

U.S. PATENT DOCUMENTS

| | | | | |
|---|---|---|---|---|
| 2014/0176958 | A1* | 6/2014 | Flanders | H01S 5/02415 372/20 |
| 2014/0219301 | A1* | 8/2014 | Chung | H01S 5/18366 372/28 |
| 2014/0268169 | A1* | 9/2014 | Jayaraman | H01S 5/18366 372/20 |
| 2016/0079736 | A1* | 3/2016 | Yvind | G01B 9/02002 156/60 |
| 2019/0348815 | A1* | 11/2019 | Johnson | H01S 5/02345 |
| 2020/0067281 | A1* | 2/2020 | Curwen | H01S 5/3401 |
| 2021/0050712 | A1* | 2/2021 | Johnson | H01S 5/18366 |

OTHER PUBLICATIONS

[No Author Listed], Mode Decomposition. MEEP Documentation. 2022. 34 pages. https://meep.readthedocs.io/en/latest/Python_Tutorials/Mode_Decomposition/ [Last accessed Oct. 19, 2022].
Ansbaek et al., Vertical-cavity surface-emitting lasers for medical diagnosis. Research Paper), Sep. 2012;30.
Bobrov et al., VCSEL polarization control by rhomboidal selectively-oxidized current aperture. 2016 International Conference Laser Optics (LO) Jun. 27, 2016:R3-16.
Chong et al., Theoretical gain of strained-layer semiconductor lasers in the large strain regime. IEEE journal of quantum electronics. Feb. 1989;25(2):171-8.
Coldren et al., Diode lasers and photonic integrated circuits. John Wiley & Sons; Mar. 2, 2012. 723 pages.
Cook et al., Air Cavity Dominant VCSELs with a Wide Wavelength Sweep. Optical Society of America. 2018. 10 pages.
Debernardi et al., Reliable polarization control of VCSELs through monolithically integrated surface gratings: a comparative theoretical and experimental study. IEEE Journal of selected topics in quantum electronics. Feb. 22, 2005;11(1):107-16.
Flanders, Submicrometer periodicity gratings as artificial anisotropic dielectrics. Applied Physics Letters. Mar. 15, 1983;42(6):492-4.
Ha et al., Polarization control of vertical-cavity surface-emitting lasers by asymmetric oxide-aperture. Technical Digest. CLEO/Pacific Rim'99. Pacific Rim Conference on Lasers and Electro-Optics (Cat. No. 99TH8464) Aug. 30, 1999(3);890-91.
Jayaraman et al., VCSEL swept light sources. Optical Coherence Tomography. 2015:659.
Johnson et al., OCT applications in optics R&D and manufacturing. Optical Coherence Tomography and Coherence Domain Optical Methods in Biomedicine XXV Mar. 5, 2021 (11630);112-17.
Johnson et al., Tunable 1060nm VCSEL co-packaged with pump and SOA for OCT and LiDAR. Optical Coherence Tomography and Coherence Domain Optical Methods in Biomedicine XXIII Feb. 22, 2019 (10867);5-14. SPIE.
Kawaguchi, Polarization-bistable vertical-cavity surface-emitting lasers: application for optical bit memory. Opto-Electronics Review. Dec. 1, 2009;17(4):265-74.
Matsui et al., Complete polarization mode control of long-wavelength tunable vertical-cavity surface-emitting lasers over 65-nm tuning, up to 14-mW output power. IEEE Journal of Quantum Electronics. Sep. 4, 2003;39(9):1037-48.
Niskiyama et al., Highly strained GaInAs—GaAs quantum-well vertical-cavity surface-emitting laser on GaAs (311) B substrate for stable polarization operation. IEEE Journal of Selected Topics in Quantum Electronics. Mar. 2001;7(2):242-8.
Okuno et al., 1.3 μm wavelength vertical cavity surface emitting laser fabricated by orientation-mismatched wafer bonding: A prospect for polarization control. Applied physics letters. Apr. 14, 2003;82(15):2377-9.
Orfanidis, Multilayer structures. Electromagnetic Waves and Antennas. 2002:186-240.
Ortsiefer et al., Polarization control in buried tunnel junction VCSELs using a birefringent semiconductor/dielectric subwavelength grating. IEEE Photonics Technology Letters. Oct. 23, 2009;22(1):15-7.
Ostermann et al., Polarization-controlled surface grating VCSELs under externally induced anisotropic strain. IEEE Photonics Technology Letters. Aug. 8, 2007;19(17):1301-3.
Qiao et al., Wide, Continuously Swept VCSEL Using a Novel Air-Cavity-Dominant Design. Optical Fiber Communication Conference Mar. 11, 2018;Th1I-7. Optical Society of America.
Rao et al., Long-wavelength VCSEL using high-contrast grating. IEEE Journal of Selected Topics in Quantum Electronics. Feb. 12, 2013;19(4):1701311.
Sato et al., Polarization bistable characteristics of mesa structure 980 nm vertical-cavity surface-emitting lasers. Japanese journal of applied physics. Apr. 14, 2006;45(4L):L438.
Yariv et al., Electromagnetic propagation in periodic stratified media. I. General theory. JOSA. Apr. 1, 1977;67(4):423-38.
Yoshikawa et al., Polarization-controlled single-mode VCSEL. IEEE journal of quantum electronics. Jun. 1998;34(6):1009-15.
Zheng et al., Control of polarization phase offset in low threshold polarization switching VCSELs. IEEE Photonics Technology Letters. Dec. 10, 2010;23(5):305-7.

* cited by examiner

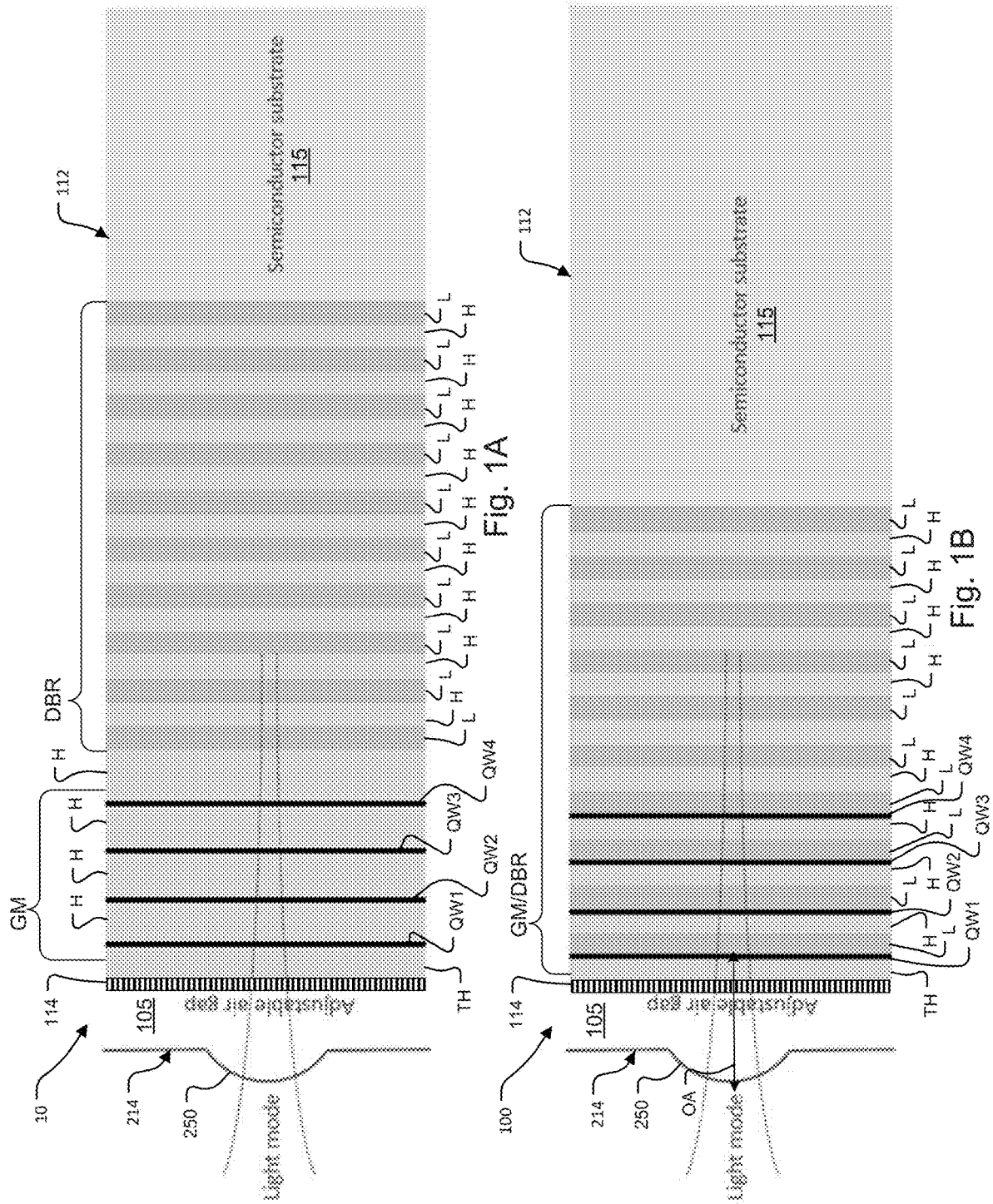

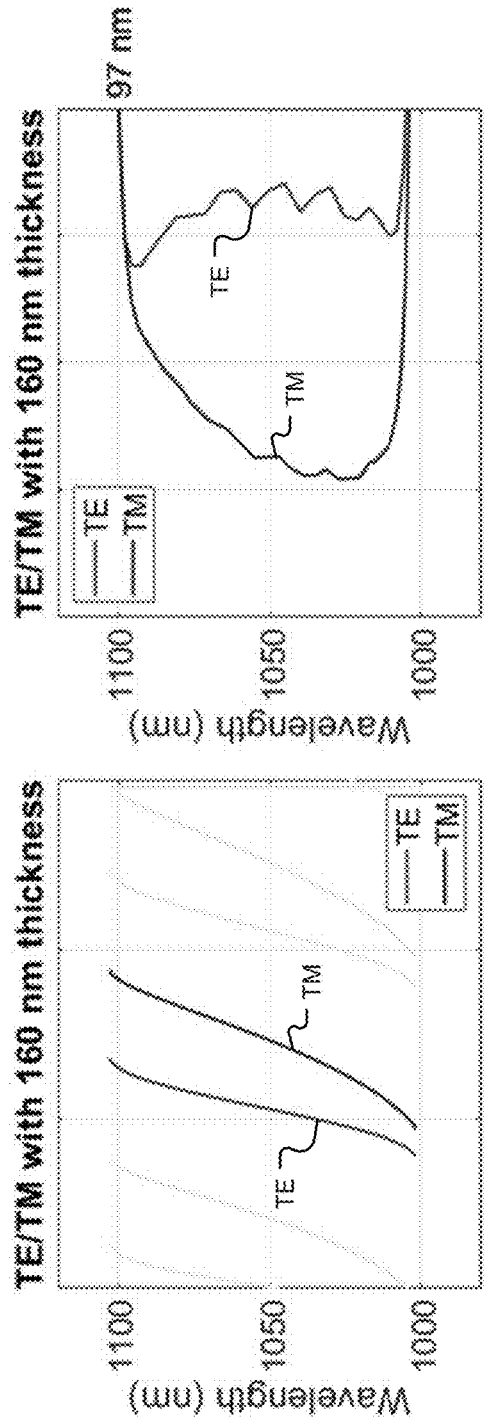
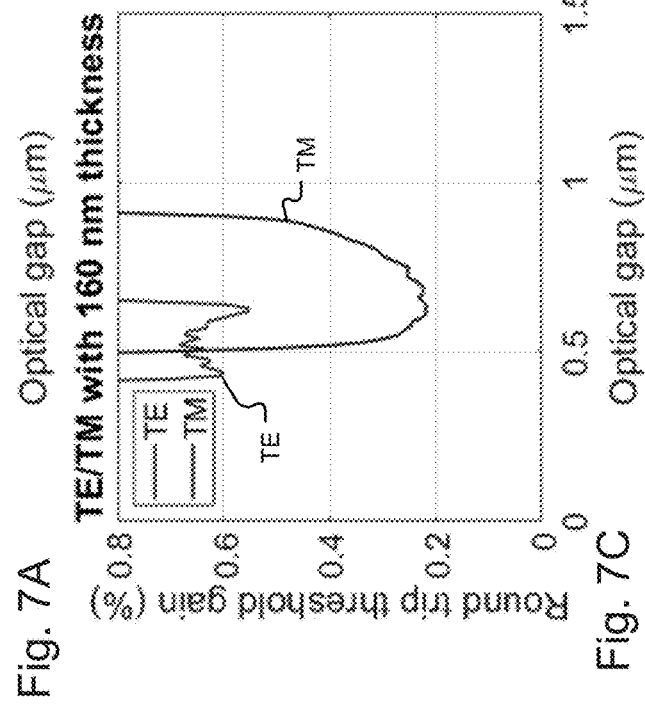
Fig. 7A
Fig. 7B
Fig. 7C

TUNABLE VCSEL POLARIZATION CONTROL WITH INTRACAVITY SUBWAVELENGTH GRATING

RELATED APPLICATIONS

This application claims the benefit under 35 USC 119(e) of U.S. Provisional Application No. 63/167,209, filed on Mar. 29, 2021, which is incorporated herein by reference in its entirety.

BACKGROUND OF THE INVENTION

Vertical cavity surface emitting lasers (VCSELs) need asymmetry built into the device for controlled linear polarized output. This asymmetry can be provided by rectangular mesas. See, e.g., Y. Sato, T. Mori, Y. Yamayoshi, and H. Kawaguchi, "Polarization Bistable Characteristics of Mesa Structure 980 nm Vertical-Cavity Surface-Emitting Lasers", Japanese Journal of Applied Physics, 45, L438-L440, (2006). Another option is the use of high contrast grating mirrors as described in Y. Rao, W. Yang, C. Chase, M. C. Y. Huang, D. P. Worland, S. Khaleghi, M. R. Chitgarha, M. Ziyadi, A. E. Willner, and C. J. Chang-Hasnain, "Long-Wavelength VCSEL Using High-Contrast Grating", IEEE J. Selected Topics in Quantum Electronics, 19, 1701311-1701311 (2013) or Thor Ansbæk Ph.D. thesis, "Vertical-cavity surface-emitting lasers for medical diagnosis", Department of Photonics Engineering at The Technical University of Denmark (2012). Another option is a subwavelength grating. This is discussed in M. Ortsiefer, M. Goerblich, Y. Xu et al., Polarization control in buried tunnel junction VCSELs using a birefringent semiconductor/dielectric subwavelength grating. IEEE Photon. Technol. Lett. 22, 15-17 (2010).

There are still further asymmetry examples. The strain from oxidized DBR mirrors can be used as described in V. Jayaraman, J. Jiang, B. Potsaid, M. Robertson, P. J. S. Heim, C. Burgner, D. John, G. D. Cole, I. Grulkowski, J. G. Fujimoto, A. M. Davis, and A. E. Cable, "VCSEL Swept Light Sources", Section 22.5.4 Polarization stability, in *Optical Coherence Tomography*, W. Drexler, J. G. Fujimoto (eds.), Springer International Publishing Switzerland 2015. In addition, asymmetric metal strain films can be applied to the crystal. See Y. Matsui, D. Vakhshoori, P. Wang, P. Chen, C-C. Lu, M. Jiang, K. Knopp, S. Burroughs, and P. Tayebati, "Complete Polarization Mode Control of Long-Wavelength Tunable Vertical-Cavity Surface-Emitting Lasers Over 65-nm Tuning, Up to 14-mW Output Power", IEEE J. Quantum Electronics, 39, 1037-1048 (2003). In addition, asymmetric current apertures have been proposed. See M. A. Bobrov, N. A. Maleev, S. A. Blokhin, A. G. Kuzmenkov, A. P. Vasil'ev, A. A. Blokhin, M. M. Kulagina, Yu. A. Guseva, S. I. Troshkov, W. Lysak, and V. M. Ustinov, "VCSEL polarization control by rhomboidal selectively-oxidized current aperture", 2016 International Conference Laser Optics (LO) Page R3-16 (2016) and K-H. Ha and Y-H. Lee, "Polarization Control of Vertical-Cavity Surface-emitting Lasers by Asymmetric Oxide-aperture", (CLEO) Conference on Lasers and Electro-Optics/Pacific Rim '99/Paper 2.30, Pages 890-891.

Surface gratings can also be used to control polarization as outlined in P. Debernardi, J. M. Ostermann, M. Feneberg, C. Jalics, and R. Michalzik, "Reliable Polarization Control of VCSELs Through Monolithically Integrated Surface Gratings: A Comparative Theoretical and Experimental Study", IEEE J. on Selected Topics in Quantum Electronics, 11, 107-116 (2005).

Another option is growth on tilted crystal planes. See N. Nishiyama, M. Arai, S. Shinada, M. Azuchi, T. Miyamoto, F. Koyama, and K. Iga, "Highly Strained GaInAs—GaAs Quantum-Well Vertical-Cavity Surface-Emitting Laser on GaAs (311)B Substrate for Stable Polarization Operation", IEEE J. on Selected Topics in Quantum Electronics, 7, 242-248 (2001) and Y. L. Okuno, J. Geske, K-G. Gan, Y-J. Chiu, S. P. DenBaars, and J. E. Bowers, "1.3 mm wavelength vertical cavity surface emitting laser fabricated by orientation-mismatched wafer bonding: A prospect for polarization control", Applied Physics Letters, 82, 2377-2379 (2003).

J. M. Ostermann, P. Debernardi, A. Kroner, and R. Michalzik, "Polarization-Controlled Surface Grating VCSELs Under Externally Induced Anisotropic Strain", IEEE Photonics Technology Letters, 19, 1301-1303 (2007) describe a polarization control technique using externally induced asymmetric strain.

Two additional options are 1) polarization loss anisotropy, see T. Yoshikawa, T. Kawakami, H. Saito, H. Kosaka, M. Kajita, K. Kurihara, Y. Sugimoto, and K. Kasahara, "Polarization-Controlled Single-Mode VCSEL", IEEE J. of Quantum Electronics, 34, 1009-1015 (1998), and 2) asymmetric current injection, see Y. Zheng, C-H. Lin, and L. A. Coldren, "Control of Polarization Phase Offset in Low Threshold Polarization Switching VCSELs," IEEE Photonics Technology Letters, 23, 305-307 (2011).

In addition, Bart Johnson, Walid Atia, Seungbum Woo, Carlos Melendez, Mark Kuznetsov, Tim Ford, Nate Kemp, Joey Jabbour, Ed Mallon, Peter Whitney, in "Tunable 1060 nm VCSEL co-packaged with pump and SOA for OCT and LiDAR," Proc. SPIE 10867, Optical Coherence Tomography and Coherence Domain Optical Methods in Biomedicine XXIII, 1086706 (22 Feb. 2019), describe that an asymmetric strain can be induced by thermo-compression bonding silicon and GaAs die together at high temperature. Strain is caused by the different coefficients of thermal expansion of these dissimilar materials. Asymmetric bond pads make the strain different in the vertical and horizontal directions. This strain asymmetry was verified through finite element analysis and a birefringence measurement with optical coherence tomography. See Bart Johnson, Joey Jabbour, Mark Malonson, Mark Kuznetsov, Walid Atia, Nate Kemp, Peter Whitney, "OCT applications in optics R&D and manufacturing," Proc. SPIE 11630, Optical Coherence Tomography and Coherence Domain Optical Methods in Biomedicine XXV, 1163023 (5 Mar. 2021).

The asymmetric strain causes a large birefringence in the ½ VCSEL crystal that is very effective in selecting vertical or horizontal polarization, the two eigenpolarizations of the cavity. In theory, it also preferentially raises the gain for one polarization over the other. See T. C. Chong and C. G. Fonstad, "Theoretical gain of strained-layer semiconductor lasers in the large strain regime," in IEEE Journal of Quantum Electronics, vol. 25, no. 2, pp. 171-178, February 1989 and Larry A. Coldren, Scott W. Corzine, and Milan L. Masanovic, Diode Lasers and Photonic Integrated Circuits, second edition, Wiley (2012). This second mechanism is less effective, and the lasing polarization is not always vertical. It is still strongly linearly polarized parallel to the 110 or HO crystal planes of the III-V wafer, however. There are also other mechanisms, such as modal dependent reflectivity at the AR coating interface for astigmatic beams that are not tightly controlled. There are probably several weak competing mechanisms that determine whether the final polarization is vertical or horizontal.

SUMMARY OF THE INVENTION

The present invention concerns polarizing mechanisms designed into a tunable vertical cavity surface emitting laser (TVCSEL). The mechanisms can be stronger than some of those previously discussed and can further be integrated into a design. Specifically, it employs a subwavelength grating etched into the semiconductor surface, such as a III-V semiconductor. This grating can be used in place of any antireflective (AR) coating.

In general, according to one aspect, the invention features a tunable vertical surface emitting laser, comprising a deflectable membrane device carrying a mirror and a half VCSEL defining an optical cavity of the laser. According to the invention, a subwavelength grating is provided in the optical cavity.

In embodiments, the subwavelength grating is located on the half VCSEL. In particular, it can be formed on a top, such as high index, layer of the half VCSEL.

The pitch Λ of the grating is less than the laser's wavelength of operation (λ). In particular, where the layer in which the grating is fabricated has an index of refraction of n and the wavelength of operation of the device is λ, then the grating pitch Λ is less than λ/n, and preferably much less λ/n. In one specific example, λ/n is about 330 nanometers (nm) and Λ is less than 300 nm or preferably about 200 nm.

In embodiments, the grating has a 50% duty cycle. The grating is alternating material and air, such as alternating InGaP and air.

In addition, the grating replaces the typical antireflective coating on the half VCSEL.

In general, according to another aspect, the invention features a method for fabricating a tunable vertical surface emitting laser, comprising forming a deflectable membrane device and a half VCSEL device defining an optical cavity of the laser and forming a subwavelength grating into the half VCSEL device, such as by etching.

In general, according to another aspect, the invention features a tunable vertical surface emitting laser system. The system comprises a laser comprising a deflectable membrane device carrying a mirror and a half VCSEL defining an optical cavity of the laser and a subwavelength grating in the optical cavity and a pump chip for optically pumping the laser.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings:

FIG. 1A shows a MEMS tunable VCSEL 10 with a subwavelength grating along with the distributed Bragg reflector (DBR) mirror and the quantum wells, according to one embodiment;

FIG. 1B shows a MEMS tunable VCSEL 10 with a subwavelength grating along with the quantum wells QW in a gain embedded DBR VCSEL, according to another embodiment;

FIGS. 6A-6C show the diffracted orders in k-space, in which FIG. 6A shows the orders for a grating pitch of 1200 nm, FIG. 6B shows the orders for a grating pitch of 400 nm, and FIG. 6C shows the orders for a grating pitch of 200 nm see the vertical lines drawn in FIGS. 5A-5D for reference; FIG. 6C shows that there is no loss to diffracted orders if the grating pitch is low enough, specifically no loss if the pitch is <340 nm;

FIG. 7A shows a tuning curves and FIG. 7B shows the threshold gains for TE and TM polarizations showing a large amount of polarization discrimination, whereas FIG. 7C demonstrates that there is not even much overlap in the TE and TM tuning ranges.

DETAILED DESCRIPTION OF THE PREFERRED EMBODIMENTS

Figure 2A:
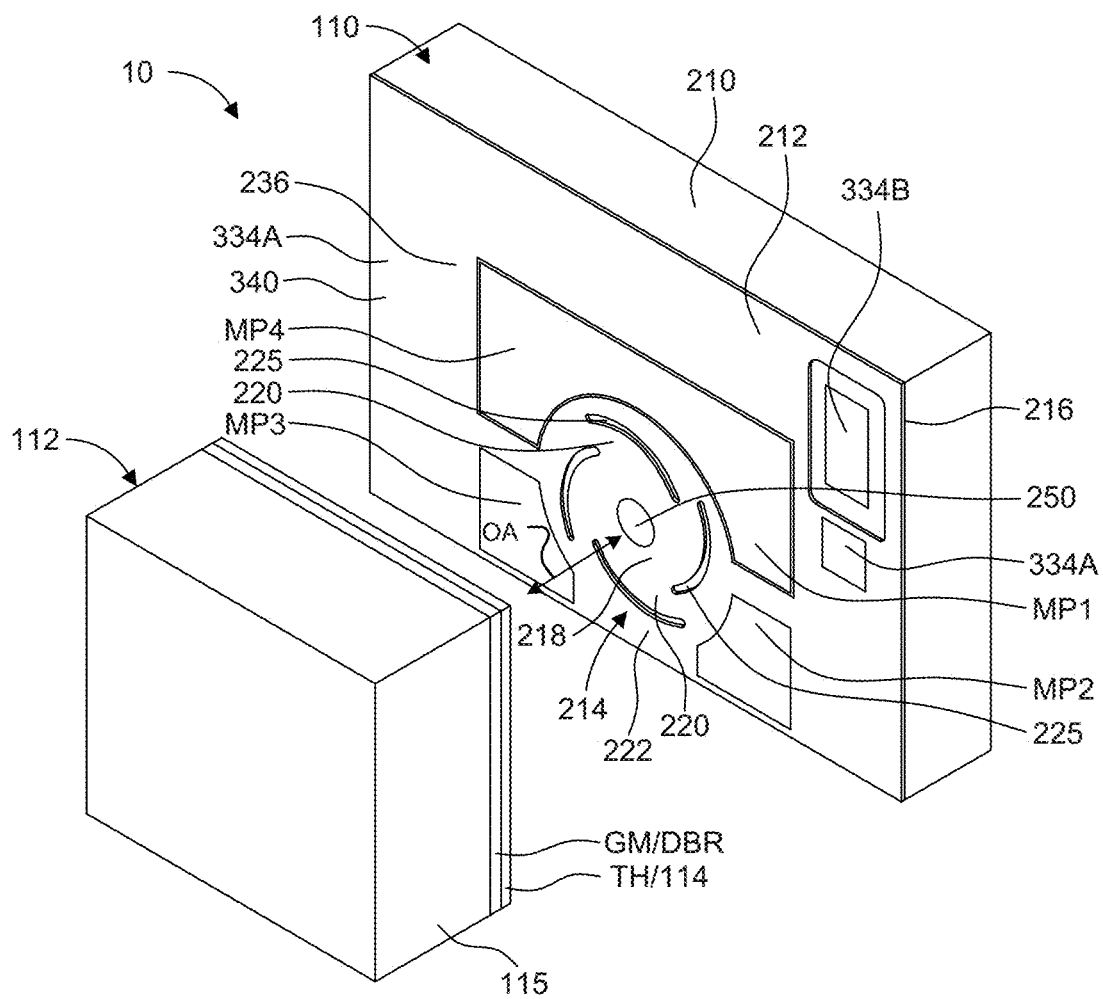
FIGS. 2A and 2B are an exploded perspective view of a wafer- or die-bonded tunable VCSEL and a schematic perspective view of the half VCSEL showing the locations of the bond pads, respectively, to which the present invention could be applied, in one example.

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "and/or" includes any and all combinations of one or more of the associated listed items. Further, the singular forms and the articles "a", "an" and "the" are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

It will be understood that although terms such as "first" and "second" are used herein to describe various elements, these elements should not be limited by these terms. These terms are only used to distinguish one element from another element. Thus, an element discussed below could be termed a second element, and similarly, a second element may be termed a first element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1A shows an arrangement for the DBR mirror and the quantum wells in a MEMS tunable VCSEL 10 with an intracavity subwavelength grating, constructed according to the principles of the present invention.

In more detail, the MEMS tunable VCSEL 10 includes a front MEMS membrane structure 214 that carries a membrane mirror 250. A ½ or half VCSEL chip or device 112 is separated from the front MEMS membrane structure 214 by an adjustable air optical gap 105, the length of which along the optical axis is tuned by deflecting the membrane structure 214.

The half VCSEL device 112 has gain medium portion GM of the half VCSEL device 112. It typically has multiple quantum well layers QW1, QW2, QW3, QW4 embedded in high index layers H. A DBR stack mirror follows the gain medium in the half VCSEL device 112. This mirror DBR is characterized by alternating layers of the high refractive index material H and low refractive index material L. In general, the DBR mirror can have as few as 4 layers to as many as 70 layers or more (1 layer=H+L), depending on the desired reflectivity and the difference in the refractive indices of the two materials used. Finally, the half VCSEL device 112 further includes a substrate 115, on which the various layers are deposited and which provides mechanical support.

According to the invention, a subwavelength grating 114 is formed into the top high index layer TH that faces or adjoins the air optical gap 105. This grating is formed, in one example, by etching a subwavelength grating at the surface of the half-VCSEL and in the top high index layer. It can supplant any antireflective (AR) coating. Etching into the InGaP cap with a 50% duty cycle results in a very high birefringence (See FIG. 4). The TE and TM indices fall on either side of the Vn.

A few fabrication techniques are appropriate for the grating. The subwavelength grating is preferably defined by E-beam lithography, UV laser interference lithography or other methods. And that lithographic result is transferred into the semiconductor by a dry etch process, in one example.

FIG. 1B shows an arrangement for the DBR mirror and the quantum wells in a MEMS tunable VCSEL 10 with an intracavity subwavelength grating, according to another embodiment. This example includes a gain embedded DBR mirror as described in US. Pat. Pub. No. 2021/0050712, which is incorporated herein by this reference.

Here, the overall cavity length is reduced in the direction of the optical axis by placing the gain medium GM inside the DBR stack mirror to create a combined gain medium and DBR mirror GM/DBR.

In general, the subwavelength grating 114 is again formed into the top high index layer TH. A subsequent first quantum well QW1 is provided followed by a low index material layer L, high index material layer H, a second quantum well QW2, then a low index material layer L, high index material layer H, a third quantum well QW3, then a low index material layer L, high index material layer H, and a fourth quantum well QW4. Then the remaining layers H, L of the DBR mirror are added for the desired reflectivity. As shown, preferably, the quantum wells are added between the high index and low index layers of the DBR mirror.

The quantum well layers QW1-QW4 are preferably placed high in the stack of the DBR mirror where the electrical fields of the reflected light are strongest. This maximizes their respective contributions to the gain.

This TVCSEL with subwavelength grating 114 is generally applicable to a number of semiconductor material systems and wavelength bands. Common material systems are based on III-V semiconductor materials, including binary materials, such as GaN, GaAs, InP, GaSb, InAs, as well as ternary, quaternary, and pentenary alloys, such as InGaN, InAlGaN, InGaP, AlGaAs, InGaAs, GaInNAs, GaInNAsSb, AlInGaAs, InGaAsP, AlGaAsSb, AlGaInAsSb, AlAsSb, InGaSb, InAsSb, and InGaAsSb. Collectively, these material systems support operating wavelengths from about 400 nanometers (nm) to 2000 nm, including longer wavelength ranges extending into multiple micrometer wavelengths. Semiconductor quantum well and quantum dot gain regions are typically used to obtain especially wide gain and spectral emission bandwidths. Quantum well layers may be purposely strained or unstrained depending on the exact materials and the desired wavelength coverage.

Nevertheless, the combined gain medium and DBR mirror, the GM/DBR, is very well suited to the AlGaAs/GaAs material system with strained InGaAs quantum wells as a gain medium. This system lases in a band around 1050 nm. In this material system, the high index layers H are GaAs, and the low index layers L are AlAs or similar high Al content AlGaAs alloys.

The gain medium is optically pumped in a current embodiment. The laser emission light and pump light need to come through the MEMS membrane structure if the substrate is absorptive at the pump wavelength, as it is for a GaAs substrate.

That is not necessarily true for other material systems, however. The VCSEL emission may be configured to come out of the MEMS side, the substrate side, or both. The MEMS mirror 250 is often curved for spatial mode control; but, it does not necessarily have to be so, for example in cases where thermal lensing in the half VCSEL device 112 is strong.

Figure 2B:
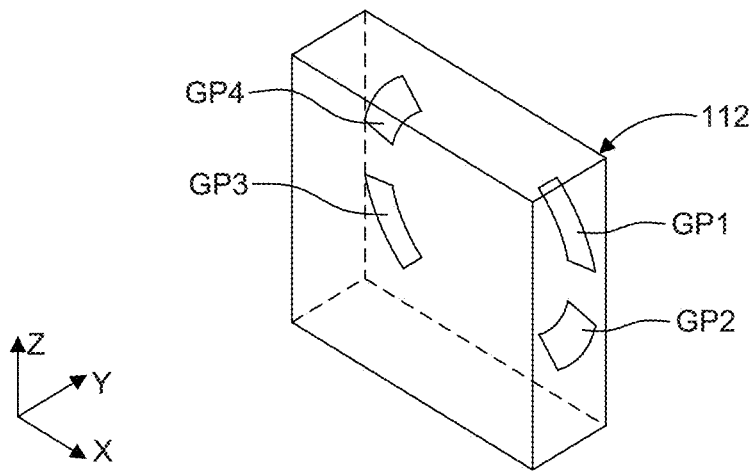

FIGS. 2A and 2B show a specific design for a MEMS tunable VCSEL 10. While many designs are possible, this one is formed by bonding the half VCSEL chip or device 112 to a silicon MEMS optical membrane device 110, which has an electrostatically movable mirror for wavelength tuning.

In more detail, the optical membrane device 110 comprises handle wafer material 210 that functions as a support. Currently, the handle is made from doped silicon to facilitate electrical contact.

An optical membrane or device layer 212 is added to the handle wafer material 210. Typically, silicon on insulator (SOI) wafers are used. An optical membrane structure 214 is formed in this optical membrane layer 212. In the current implementation, the membrane layer 212 is silicon that is low doped to minimize free carrier absorption of the transmitted light. For electrical contact, the membrane layer surface is usually additionally doped by ion implantation to create a highly doped surface layer. This method minimizes optical absorption in the membrane layer itself that would occur if the entire layer were highly doped. An insulating (buried silicon dioxide) layer 216 separates the optical membrane layer 212 from the handle wafer material 210.

During manufacture of the membrane device in the SOI wafer material, the insulating layer 216 functions as a sacrificial/release layer, which is partially removed to release the membrane structure 214 from the handle wafer material 210. Then during operation, the remaining portions of the insulating layer 216 provide electrical isolation between the patterned device layer 212 and the handle material 210.

In the current embodiment, the membrane structure 214 comprises a body portion 218. The optical axis of the device 10 passes concentrically through this body portion 218 and orthogonal to a plane defined by the membrane layer 212. A diameter of this body portion 218 is preferably 300 to 600 micrometers; currently it is about 500 micrometers.

Tethers 220 (four tethers in the illustrated example) are defined and delineated by arcuate slots 225 fabricated into the device layer 212. The tethers 220 extend radially from the body portion 218 to an outer portion 222, which comprises the ring where the tethers 220 terminate. In the current embodiment, a spiral tether pattern is used.

A membrane mirror dot 250 is disposed on body portion 218 of the membrane structure 214. In some embodiments, the membrane mirror 250 is optically curved to form an optically concave optical element to thereby form a curved mirror laser cavity. In other cases, the membrane mirror 250 is a flat mirror, or even possibly convex.

When a curved membrane mirror 250 is desired, this curvature can be created by forming a depression in the body portion 218 and then depositing the material layer or layers that form mirror 250 over that depression. In other examples, the membrane mirror 250 can be deposited with a high amount of compressive material stress that will result in its curvature.

The membrane mirror dot 250 is preferably a reflecting dielectric mirror stack. In some examples, it is a dichroic mirror-filter that provides a defined reflectivity, such as between 1 and 99.9%, to the wavelengths of laser light generated in the laser 10, whereas the optical dot 250 is transmissive to wavelengths of light that are used to optically pump the active region in the VCSEL device 112. In still other examples, the optical dot is a reflective metal layer such as aluminum or gold.

In the illustrated embodiment, four metal pads MP1, MP2, MP3, and MP4 are deposited on the proximal side of the membrane device 110. These are used to solder or thermocompression bond, for example, the half VCSEL device 112 onto the proximal face of the membrane device 110 using the gold pads GP1-4 deposited on the half VCSEL device 112.

Also provided are two wire bondpads 334A, 334B. Membrane wire bond pad 334A is used to provide an electrical connection to the membrane layer 212 and thus the membrane structure 214. The handle wire bond pad 334B is used to provide an electrical connection to the handle wafer material 210.

The half VCSEL device 112 generally comprises subwavelength grating 114 formed in the top high index layer TH and the combined or separated gain medium GM and DBR mirror DBR.

In still other examples, the DBR mirror DBR is a dichroic mirror-filter that provides a defined reflectivity, such as greater than 99% to the wavelengths of laser light generated in the laser 10, whereas the DBR is transmissive to wavelengths of light that are used to optically pump the active region in the VCSEL device 112, thus allowing the half VCSEL device 112 to function as an input port of pump light.

In the example of a VCSEL operating with a center wavelength around 1050 nm, the mirror reflectivities tend toward higher numbers for light around 1050 nm in wavelength. For example, the reflectivity of the DBR is about 99.99%. On the other hand, the front mirror dot 250 is usually 99% or greater. In current embodiments, the mirror dot 250 has a reflectivity of about 99.4% or higher.

In operation, the VCSEL device is electrically or optically pumped. The generated light resonates between the DBR mirror DBR and membrane mirror 250. The wavelength of the generated light is tuned within the scan band of the device by the out of plane electrostatic deflection of the body portion 218 and thus the membrane mirror 250 by controlling the electrostatic field between the body portion 218 and the handle wafer material 210 and/or the half VCSEL device 112. The device wavelength sweeping over the range of about 1000 nm to 1100 nanometers.

FIG. 2B is schematic view showing the hidden bond pads GP1-GP4 on the half VCSEL device 112.

The thin gold pads GP1-GP4 on the ½ VCSEL device 112 are thermocompression bonded to corresponding membrane pads MP1, MP2, MP3, and MP4 of the MEMS membrane (mirror) device 110 by placing them in contact at high pressure and temperature to form the bond. Typically, this is done at 300-360° C. and 1-10N force. Other elevated temperature bonding methods, such as gold-tin and/or eutectic soldering, can be used to produce a similar effect, however.

Figure 3:
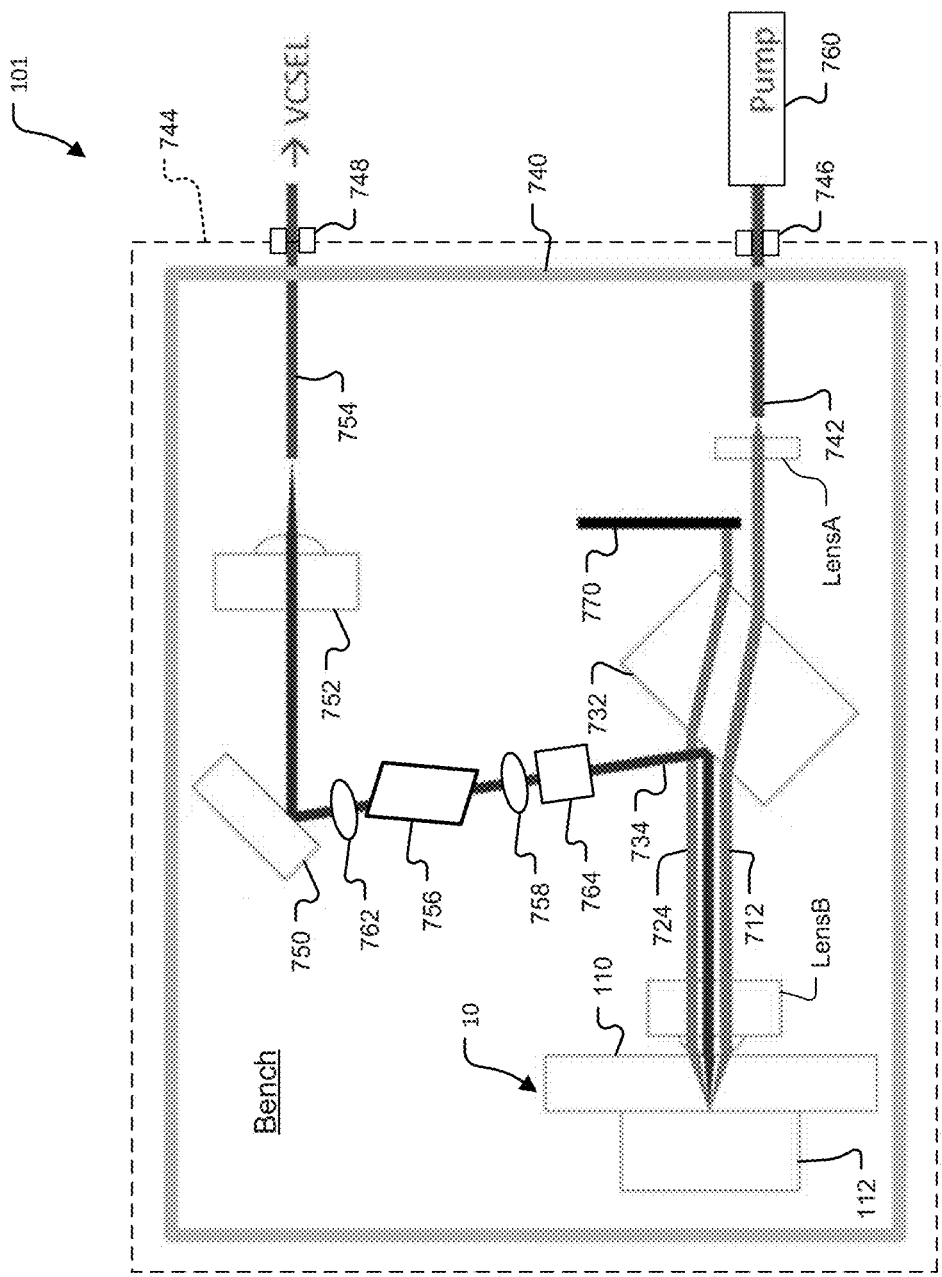
FIG. 3 is a top plan view of an optically pumped tunable VCSEL swept source module including the tunable VCSEL with subwavelength grating.

FIG. 3 also shows an example optically pumped tunable VCSEL swept source system 101 employing the subwavelength polarization stabilized VCSEL 10, which system has been integrated into a single module.

Light from a pump chip 760 is coupled to a bench 740 via a pump optical fiber 742. The chip can also be integrated directly onto the bench for a higher level of integration. The pump light 712 from the optical fiber 742 is collimated by a first lens LensA that is affixed to the bench 740. The pump light 712 then is transmitted through the dichroic mirror 732 and then focused by a second lens LensB onto the half VCSEL 112 of the VCSEL 100.

Preferably, the bench 740, in turn, is installed in a hermetic package 744 with optical fibers passing through fiber-feedthroughs 746, 748 of the package 744.

The dichroic mirror 732 is reflective to longer wavelength of the VCSEL light 734, emitted by the VCSEL 10, but transmissive to the pump light 712, 724 in the illustrated example. Specifically in the illustrated example, the tunable signal from the VCSEL 10 is reflected by the dichroic mirror 732, which is affixed to the bench 740, and directed to a fold mirror 750 which is also affixed to the bench 740 and then to a third lens 752, which is affixed to the bench 740. The third lens 752 focuses light into an entrance aperture of an output optical fiber 754.

More details of this specific design can be found in U.S. Pat. Appl. Pub. No. US 2019/0348813 A1, which is incorporated herein by this reference in its entirety.

Additionally, a gain can be added to the system 101. For example a semiconductor optical amplifier (SOA) chip 756 is also shown installed on the bench 740. Typically, an in-coupling lens 758 and a collimating lens 762 are added on the input and output of the SOA chip 756, respectively. The SOA 756 boosts the power from the VCSEL 10. An isolator 764 is also useful between the SOA 756 and the VCSEL 10 to spoil any parasitic optical cavities.

Subwavelength Grating Design Considerations

For normal incidence, gratings with pitches $\Lambda < \lambda/n$ cannot diffract, where n is the substrate index, $\Lambda$ the grating pitch, and $\lambda$ the wavelength. These gratings are still optically active, exhibiting a uniform birefringence that can be very large. See Dale C. Flanders, "Submicrometer periodicity gratings as artificial anisotropic dielectrics," Appl. Phys. Lett. 42, 492 (1983) and Amnon Yariv and Pochi Yeh, "Electromagnetic propagation in periodic stratified media. II. Birefringence, phase matching, and x-ray lasers," J. Opt. Soc. Am. 67, 438-447 (1977). For grating materials with bulk indices $n_1$ and $n_2$, the indices of the layered structure for E-fields parallel (TE) and perpendicular (TM) to the grooves are:

$$n_{TE} = \sqrt{n_1^2(q) + n_2^2(1-q)} \quad (1)$$

$$n_{TM} = \frac{1}{\sqrt{(1/n_1^2)(q) + (1/n_2^2)(1-q)}} \quad (2)$$

where q is the material fill factor. These expressions are valid for the limit where $\Lambda << \lambda/n$. If this limit cannot be reached by reasonable lithography, the birefringence can be determined by an electromagnetic field solver. The following table gives example index numbers for the semiconductor InGaP lattice matched to GaAs.

| Material | q | index |
|---|---|---|
| n = InGaP at 1050 nm | | 3.22 |
| $\sqrt{n}$ | | 1.79 |
| nTE | 0.5 | 2.38 |
| nTM | 0.5 | 1.35 |
| nTE − nTM | | 1.03 |

A photonic crystal simulator was used to calculate the properties of a grating etched 160 nm deep into InGaP. Looking into its transmission and reflection versus grating pitch as a design exercise showed that these gratings are lossless for short enough grating pitches. At longer pitches, the grating diffracts at angles, introducing loss to the VCSEL cavity.

Figure 4:
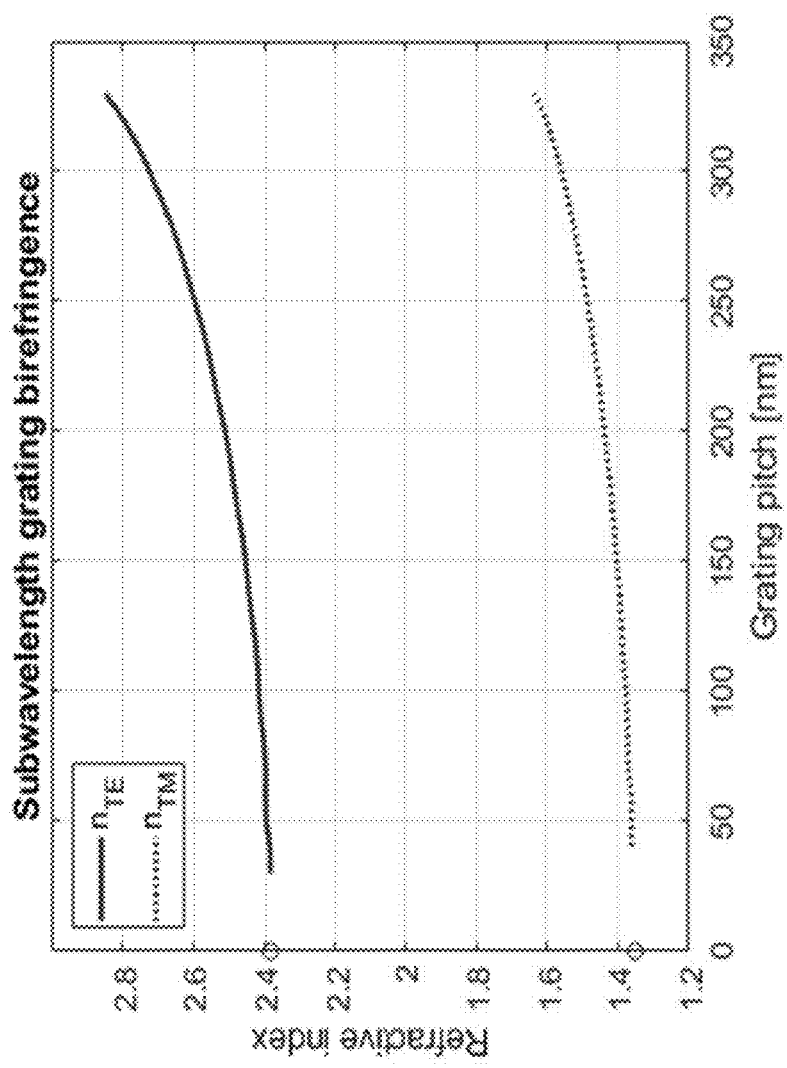
FIG. 4 is a plot of refractive index as a function of grating pitch in nanometers for an InGaP layer with subwavelength grating and 50% duty cycle, the layer being alternating InGaP and air.

FIG. 4 shows the TE and TM refractive indices versus grating pitch calculated by MPB, which is an electromagnetic field calculation program from MIT called "MIT Photonic Bands (MPB)". They asymptotically approach the values calculated by equations (1) and (2).

Figure 5A:
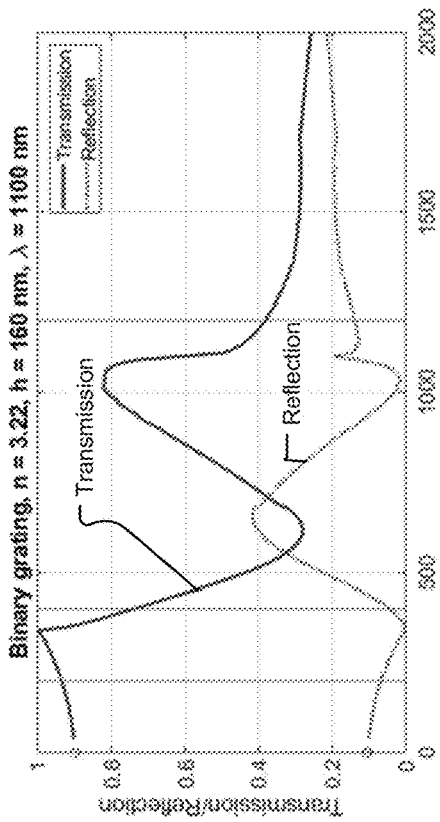
FIGS. 5A-5D are plots of transmission and reflection as a function of grating pitch in nanometers for a 160 nanometer (nm) deep InGaP.
Figure 5B:
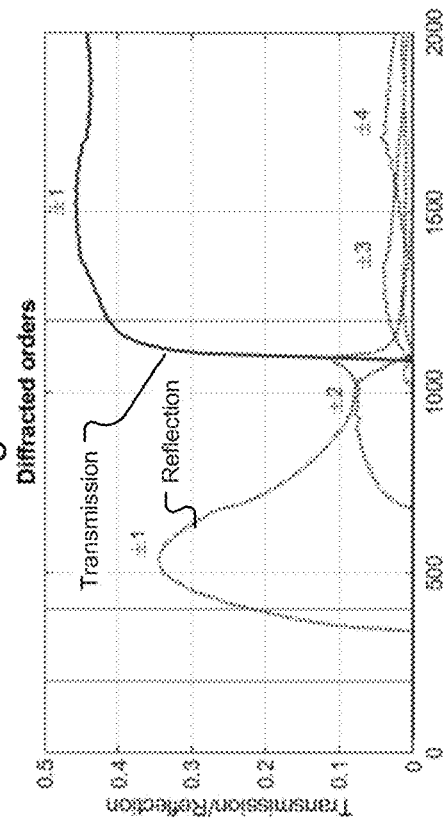
Figure 5C:
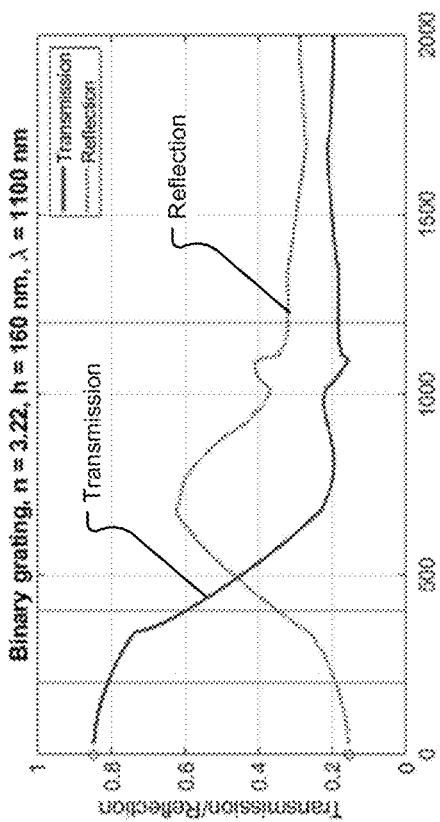
Figure 5D:
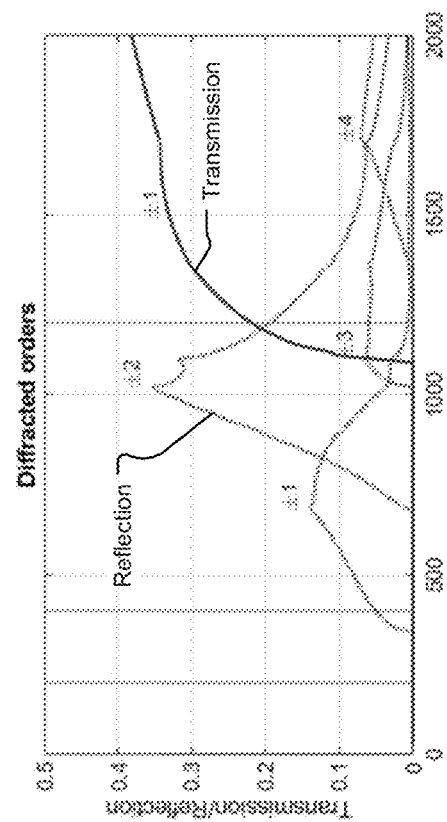

FIGS. 5A-5D are plots of transmission and reflection as a function of grating pitch in nanometers for a 160 nm deep InGaP grating for a tunable laser operating around 1100 nm in wavelength. FIGS. 5A and 5B are plots for the transmitted and reflected waves normal to the surface of the grating 114. FIGS. 5C and 5D are plots for the diffraction orders. Note that there is no diffraction for grating pitches less than $\lambda/n$, or 340 nm in this case.

Figure 6A:
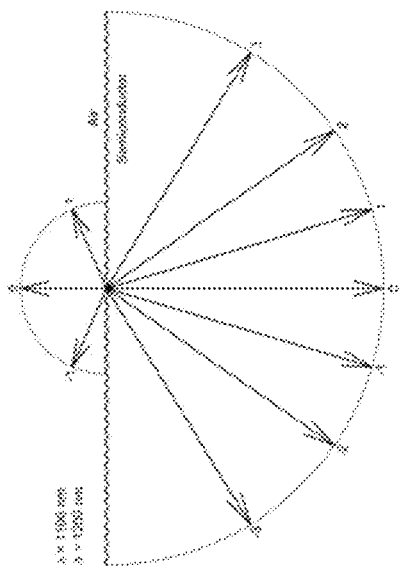
Figure 6B:
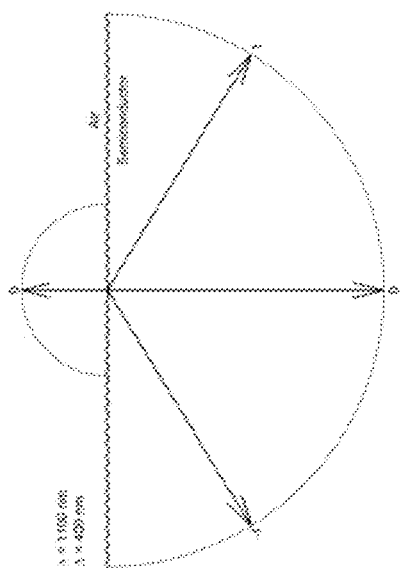
Figure 6C:
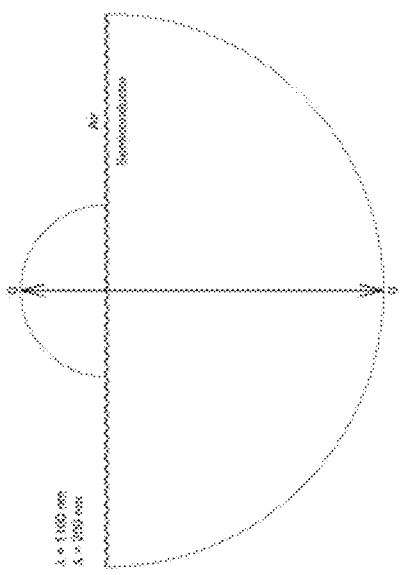

FIGS. 6A-6C show the diffracted orders in k-space. They are for grating pitches 1200 nm (FIG. 6A), 400 nm (FIG. 6B), and 200 nm (<340 nm) (FIG. 6C). See the vertical lines drawn in FIGS. 5A-5D for reference.

Threshold Gain Asymmetry

FIGS. 7A-7C are plots of wavelength in nanometers as a function of optical gap in micrometers, wavelength in nanometers as a function of round trip threshold gain in percent; and round trip threshold gain in percent as a function of optical gap in micrometers for each of the TE and TM polarizations. The curves show a large amount of polarization discrimination. Threshold gain disparity aside, the curves show that there is not even much overlap in the TE and TM tuning ranges.

Thus, threshold gain curves show a big advantage for TM polarization in a VCSEL and especially the design of FIG. 1B, where the VCSEL does not lase for many optical gap settings. The TE and TM modes resonate at different wavelengths for the same gap setting; however, only the TM mode will lase because of its lower threshold gain. The TM mode also has less sensitive tuning, which is an advantage as well.

In general, gain is added by manipulating the imaginary parts of the refractive index of the quantum well layers. The reflectivity is calculated of all the layers in the VCSEL, the MEMS membrane AR and HR dielectric layers, the air gap, and all of the III-V semiconductor layers. The threshold gain is the point where the stack reflectivity is maximum.

The lower gain requirements for TM polarization are not a result of less loss in the cavity. The subwavelength grating 114 is theoretically lossless. It is a result of the distribution of energy within the cavity. On other designs with an AR coating between the III-V semiconductor and the air gap, this AR coating plays a large role distribution of energy within the cavity. For example, a quarter-wave coating of index $\sqrt{n}$ is a perfect AR coating for a semiconductor index of n. Departing from the perfect AR coating, an index $>\sqrt{n}$ pushes energy into the air-side of the cavity. A layer $<\sqrt{n}$ lumps optical energy to the semiconductor side. These are the air-cavity-dominant and semiconductor-cavity-dominant cases. With more powerful standing waves extracting gain from the quantum wells, the semiconductor-cavity-dominant design has lower threshold. The VCSEL will prefer the lower threshold mode of operation. This is done without adding any polarization-dependent loss to the cavity. The subwavelength grating makes the TE cavity air dominant and the TM cavity semiconductor dominant and causes a large difference in the threshold gain.

The present approach provides a very strong selection mechanism by manipulating the laser threshold to be different for TE and TM polarizations. The laser selects the polarization with the lowest threshold. This preference is created by the subwavelength grating 114. The grating does not diffract and does not add loss to the cavity. It works by creating a large birefringence layer between the semiconductor and air sub-cavities of the full VCSEL. Multilayer stack calculation show that this results in a lower threshold for the TM polarization over the TE.

While this invention has been particularly shown and described with references to preferred embodiments thereof, it will be understood by those skilled in the art that various changes in form and details may be made therein without departing from the scope of the invention encompassed by the appended claims.

What is claimed is:

1. A tunable vertical surface emitting laser configured to emit light at least at a wavelength ($\lambda$), comprising:
    a deflectable membrane device carrying a mirror and a half VCSEL defining an optical cavity of the laser; and
    a subwavelength grating formed in a material in the optical cavity, wherein the material has a refractive index (n), and wherein the subwavelength grating has a pitch ($\Lambda$) that is less than $\lambda/n$.

2. The laser of claim 1, wherein the subwavelength grating is located on the half VCSEL.

3. The laser of claim 1, wherein the subwavelength grating formed on a top high index layer of the half VCSEL.

4. The laser of claim 1, wherein the half VCSEL includes a distributed Bragg reflector.

5. The laser of claim 1, wherein the grating has a 50% duty cycle.

6. The laser of claim 1, wherein the grating is alternating material and air.

7. The laser of claim 1, wherein the grating is alternating InGaP and air.

8. The laser of claim 1, wherein the grating replaces an antireflective coating on the half VCSEL.

9. A method for fabricating a tunable vertical surface emitting laser configured to emit light at least at a wavelength ($\lambda$), comprising:
   forming a deflectable membrane device and a half VCSEL device defining an optical cavity of the laser; and
   forming a subwavelength grating into a material in the half VCSEL device, wherein the material has a refractive index (n), and wherein the subwavelength grating has a pitch ($\Lambda$) that is less than $\lambda/n$.

10. The method of claim 9, wherein the subwavelength grating is etched into the half VCSEL device.

11. The method of claim 9, wherein the subwavelength grating is etched into on a top high index layer of the half VCSEL.

12. The method of claim 9, wherein the grating has a 50% duty cycle.

13. The method of claim 9, wherein the grating is alternating material and air.

14. The method of claim 9, wherein the grating is alternating InGaP and air.

15. The method of claim 9, wherein the grating replaces an antireflective coating on the half VCSEL.

16. The method of claim 9, wherein the forming the subwavelength grating comprises etching the half VCSEL device.

17. The method of claim 9, wherein the subwavelength grating is defined by lithography.

18. A tunable vertical surface emitting laser system configured to emit light at least at a wavelength ($\lambda$), comprising:
   a laser comprising a deflectable membrane device carrying a mirror and a half VCSEL defining an optical cavity of the laser and a subwavelength grating formed in a material in the optical cavity, wherein the material has a refractive index (n), and
   wherein the subwavelength grating has a pitch ($\Lambda$) that is less than $\lambda/n$; and
   a pump chip for optically pumping the laser.

* * * * *